United States Patent
Wu et al.

(10) Patent No.: US 7,087,924 B2
(45) Date of Patent: Aug. 8, 2006

(54) GALLIUM-NITRIDE BASED LIGHT EMITTING DIODE STRUCTURE WITH ENHANCED LIGHT ILLUMINANCE

(75) Inventors: Liang-Wen Wu, Banciao (TW); Ru-Chin Tu, Tainan (TW); Cheng-Tsang Yu, Wufong (TW); Tzu-Chi Wen, Tainan (TW); Fen-Ren Chien, Yonghe (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 32 days.

(21) Appl. No.: 10/942,434

(22) Filed: Sep. 16, 2004

(65) Prior Publication Data
US 2006/0038193 A1    Feb. 23, 2006

(30) Foreign Application Priority Data
Aug. 18, 2004    (TW) ............................ 93124816 A

(51) Int. Cl.
*H01L 29/06* (2006.01)

(52) U.S. Cl. ............................ 257/22; 257/13; 257/15; 257/97; 257/102

(58) Field of Classification Search .................. 257/13, 257/15, 18, 22, 97, 102, E33.008, E33.01, 257/E33.017, E33.019, E33.021, E33.023, 257/E33.024, E33.025, E33.027, E33.028, 257/E33.029, E33.032, E33.033
See application file for complete search history.

(56) References Cited

U.S. PATENT DOCUMENTS 6,849,864 B1 *    2/2005    Nagahama et al. ........... 257/22

* cited by examiner

*Primary Examiner*—George Fourson
*Assistant Examiner*—Julio J. Maldonado

(57) ABSTRACT

Disclosed is a multi-quantum-well light emitting diode, which makes enormous adjustments and improvements over the conventional light emitting diode, and further utilizes a transparent contact layer of better transmittance efficiency, so as to significantly raise the illuminance of this light emitting diode and its light emission efficiency. The multi-quantum-well light emitting diode has a structure including: substrate, buffer layer, n-type gallium-nitride layer, active light-emitting-layer, p-type cladding layer, p-type contact layer, barrier buffer layer, transparent contact layer, and the n-type electrode layer.

6 Claims, 5 Drawing Sheets

GALLIUM-NITRIDE BASED LIGHT EMITTING DIODE STRUCTURE WITH ENHANCED LIGHT ILLUMINANCE

BACKGROUND OF THE INVENTION

1. Field of the Invention

The present invention relates to the gallium-nitride (GaN) based light-emitting-diode (LED) structure, and in particular to the gallium-nitride (GaN) based light emitting diode which achieves the increased light transmittance and enhanced light illuminance by means of its top transmittance contact layer using ITO (indium-tin-oxide) as its material.

2. The Prior Arts

It is known, the indium-gallium-nitride (InGaN)/gallium-nitride (GaN) multi-quantum well (MQW) LED is usually used in the prior art as the light emitting device. It has been widely utilized in the various functions and applications of static display, such as, in the clocks/watches, display screens, and advertisement panels, etc for displaying digits and/or images. However, its light illuminance and light transmittance efficiency are restricted by the property of its top transparent contact layer, and its light transmittance at present can only reach 62% at most in the visible light spectrum. Therefore, the effectiveness of its application is not very satisfactory.

Now, please refer to FIG. 1 as we explain the structure of this prior art multi-quantum well light emitting diode (MQW LED) and its restrictions. As shown in FIG. 1, its structure comprises a substrate 11, a buffer layer 12, an un-doped n-type gallium-nitride (GaN) layer 13, an n-type gallium-nitride (GaN) layer 14, a multi-quantum well (MQW) layer 15, a gallium-nitride (GaN) cladding layer 16, a p-type gallium-nitride (GaN) layer 17, a Ni/Au transparent contact layer 18, and a Ni/Al transparent contact layer 19.

In the above-mentioned structure, the lowest layer is the substrate 11 and it is made of Sapphire. The buffer layer 12 is formed on the substrate 11 and is made of low temperature growth gallium-nitride (GaN). The un-doped n-type gallium-nitride (GaN) layer 13 is formed on the buffer layer 12. Then, the n-type gallium-nitride (GaN) layer 14 is formed on un-doped n-type gallium-nitride (GaN) layer 13. Afterwards, the multi-quantum well (MQW) layer 15 is formed on the n-type gallium-nitride (GaN) layer 14, and it is made of InGaN/GaN. Formed on top of the multi-quantum well layer is the gallium-nitride (GaN) cladding layer 16. Then, p-type GaN layer 17 is formed on gallium-nitride (GaN) cladding layer 16. Finally, Ni/Au transparent contact layer 18 is formed on p-type GaN layer 17, and the Ni/Al transparent contact layer 19 is formed on the n-type gallium-nitride (GaN) layer 14.

This sort of prior art multi-quantum-well light emitting diode structure is known as the "n-Down Structure". Namely, in this structure, the InGaN/GaN multi-quantum well (MQW) active layer is grown on the n-type (n-GaN) cladding layer, and then the p-type GaN cladding layer is grown on the multi-quantum well active layer. The purpose of the light emitting diode produced in this manner is to take advantage of the superb crystal quality of the multi-quantum well (MQW) active layer, so as to achieve better current distribution in the underlying n-GaN layer, and therefore the lower turn-on voltage of the light emitting diode.

However, the main purpose of this kind of prior art multi-quantum-well light emitting diode (InGaN/GaN MQW LED) is to make use of the n-type (n-GaN) layer as the contacting layer, and the Ni/Au as the p-type conductive electrode and the transparent contact layer. According to the experiment data of FIG. 2, the maximum transmittance (namely, the transmitted percentage of the incident light) of that Ni/Au transparent contact layer in the visible light spectrum is only 62% at 530 nm. Therefore, the light emitting diode of the prior art is restricted by its intrinsic light transmittance property of this transparent contact layer, and as such its light illuminance can not be raised, and that is its major shortcomings and restrictions.

The purpose of the present invention is to improve the shortcomings and the restrictions of the afore-mentioned conventional light emitting diode, so as to achieve the purpose and function of increasing its light illuminance and light emission efficiency.

SUMMARY OF THE INVENTION

Therefore, the purpose of the present invention is to provide a kind of multi-quantum-well light emitting diode, which makes enormous adjustments and improvements over the structure of the conventional light emitting diode, and further utilizes a transparent contact layer of better transmittance efficiency, so as to significantly raise the illuminance of this light emitting diode and its light emission efficiency.

The main structure of this kind of multi-quantum-well light emitting diode includes: substrate, buffer layer, n-type gallium-nitride (GaN) layer, active light-emitting-layer, p-type cladding layer, p-type contact layer, barrier buffer layer, transparent contact layer, and the n-type electrode layer. Wherein, the bottom layer of this structure is substrate, which is made of Sapphire. Formed on top of the substrate is the buffer layer, which is made of aluminum-gallium-indium-nitride ($Al_{1-x-y}Ga_xIn_yN$; $0 \leq x,y \leq 1$ and $x+y \leq 1$). The n-type gallium-nitride (GaN) layer is formed on the buffer layer. Then, active light-emitting-layer is formed on n-type gallium-nitride (GaN) layer, and which is made of indium-gallium-nitride (InGaN). And next, p-type cladding layer is formed on the active light-emitting-layer, and which is made of Mg-doped aluminum-indium-nitride ($Al_{1-x}In_xN$). Then, p-type contact layer is formed on p-type cladding layer, and which is made of gallium-nitride (GaN). And next, the barrier buffer layer is formed on p-type contact layer, and which is made of magnesium-nitride (MgN) or undoped indium nitride (InN) or undoped indium gallium nitride ($In_xGa_{1-x}N$; $0<x<1$) or magnesium-nitride/undoped-indium-nitride (MgN/InN) or magnesium-nitride/undoped-indium-gallium-nitride ($MgN/In_xGa_{1-x}N$). Then the transparent contact layer is formed on barrier buffer layer, and which is made of indium-tin-oxide (ITO). And finally, the n-type electrode layer is formed on n-type gallium nitride (GaN) layer, and which is made of Ti/Al or Cr/Au.

The special design multi-quantum-well light emitting diode according to the present invention is characterized in that it does not make use of Ni/Au as the material for its top layer as in the prior art, but instead it utilizes ITO as the material for its top transparent contact layer. Therefore, according to the experiment data as shown in FIG. 2, the light transmittance of the transparent contact layer using ITO as its material can reach the very ideal level of 95% at 475 nm of the visible light spectrum. Namely, 95% of the light incident upon the ITO transparent contact layer can be transmitted out. Therefore, through the design of the present invention, the light illuminance and light transmittance efficiency of the multi-quantum-well light emitting diode can be significantly increased.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENTS

The various features and advantages of the present invention can be understood more thoroughly through the following detailed descriptions together with the attached drawings.

Now, please refer to the attached drawings as we describe the various Embodiments of the present invention.

Embodiment 1

Figure 3:
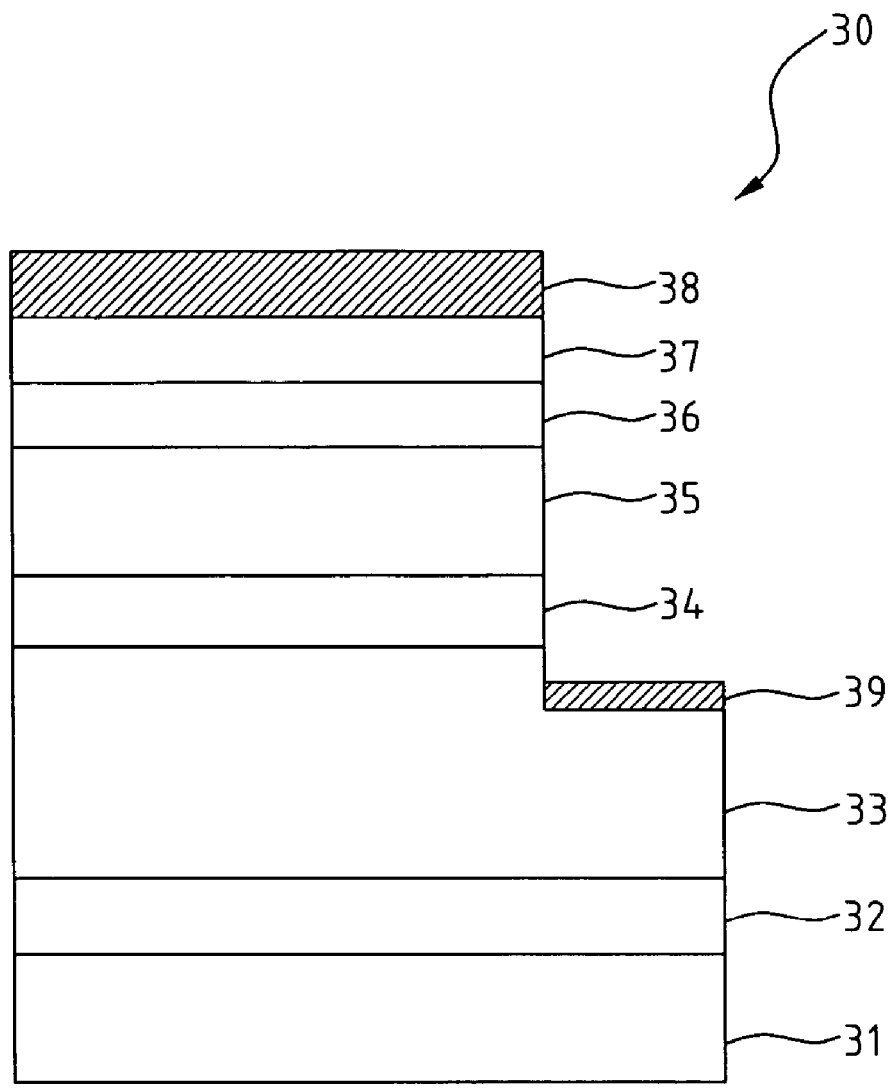
FIG. 3 is a gallium-nitride based light emitting diode structure according to the first embodiment of the present invention.

FIG. 3 shows a gallium-nitride based light emitting diode structure 30 with enhanced light illuminance according to the first embodiment of the present invention, comprising: substrate 31, buffer layer 32, n-type gallium nitride (GaN) layer 33, active light-emitting-layer 34, p-type cladding layer 35, p-type contact layer 36, barrier buffer layer 37, transparent contact layer 38, and n-type electrode layer 39.

The bottom layer of the structure is substrate 31, and it is made of Sapphire. And next, the buffer layer 32 is formed on substrate 31, and it is made of aluminum-gallium-indium-nitride ($Al_{1-x-y}Ga_xIn_yN$) wherein $0 \leq x \leq 1$, $0 \leq y \leq 1$ and $x+y \leq 1$. The n-type gallium-nitride (GaN) layer 33 is formed on buffer layer 32. The active light-emitting-layer 34 is formed on n-type gallium-nitride (GaN) layer 33, and it is made of indium-gallium-nitride (InGaN). And next, the p-type cladding layer 35 is formed on active light-emitting-layer 34, and it is made of Mg-doped aluminum-indium-nitride ($Al_{1-x}In_xN$), wherein $0 \leq x < 1$. Then, p-type contact layer 36 is formed on p-type cladding layer 35, and it is made of gallium nitride (GaN). And then barrier buffer layer 37 is formed on p-type contact layer 36, and it is made of magnesium-nitride (MgN). And next transparent contact layer 38 is formed on barrier buffer layer 37, and it is made of indium-tin-oxide. And finally the n-type electrode layer 39 is formed on n-type gallium-nitride (GaN) layer 33, and it is made of Ti/Al or Cr/Au.

In the above-mentioned structure, the thickness of the barrier buffer layer (MgN) 37 is between 2 Å and 200 Å, and its growth temperature is between 500° C. and 1200° C. In the embodiment 1, we can also use undoped indium nitride (InN) or undoped indium gallium nitride ($In_xGa_{1-x}N$; $0<x<1$) instead of magnesium-nitride (MgN) as the barrier buffer layer 37. The thickness of the barrier buffer layer (InN or $In_xGa_{1-x}N$; $0<x<1$) 37 is between 2 Å and 200 Å, and its growth temperature is between 500° C. and 1200° C.

Embodiment 2

Figure 4:
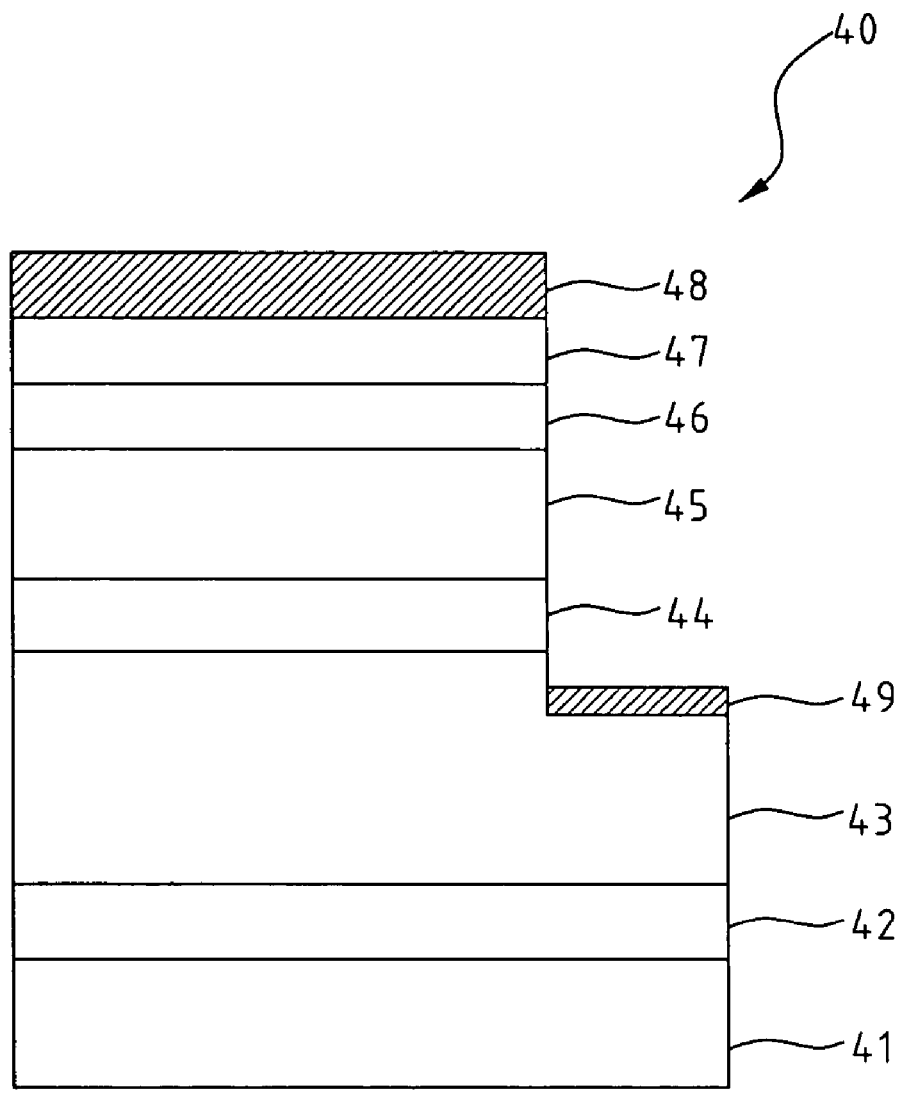
FIG. 4 is a gallium-nitride based light emitting diode structure according to the second embodiment of the present invention.

FIG. 4 shows a gallium-nitride based light emitting diode structure 40 with enhanced light illuminance according to a second embodiment of the present invention, comprising: substrate 41, buffer layer 42, n-type gallium-nitride (GaN) layer 43, active light-emitting-layer 44, p-type cladding layer 45, p-type contact layer 46, short-period super-lattice barrier buffer layer 47, transparent contact layer 48, and n-type electrode layer 49.

The bottom layer of the structure is substrate 41, and it is made of Sapphire. And next, the buffer layer 42 is formed on substrate 41, and it is made of aluminum-gallium-indium-nitride ($Al_{1-x-y}Ga_xIn_yN$), wherein $0 \leq x \leq 1$, $0 \leq y \leq 1$ and $x+y \leq 1$. Then, the n-type gallium-nitride (GaN) layer 43 is formed on buffer layer 42. And then, the active light-emitting-layer 44 is formed on n-type gallium nitride (GaN) layer 43, and it is made of indium-gallium nitride (InGaN). And next the p-type cladding layer 45 is formed on active light-emitting-layer 44, and it is made of Mg-doped aluminum-indium-nitride ($Al_{1-x}In_xN$), wherein $0 \leq x < 1$. Then, p-type contact layer 46 is formed on p-type cladding layer 45, and it is made of gallium nitride (GaN). And then, the short-period super-lattice barrier buffer layer 47 is formed on p-type contact layer 46, and it is made of magnesium-nitride/undoped-indium-nitride (MgN/InN). And next the transparent contact layer 48 is formed on the short-period super-lattice barrier buffer layer 47, and it is made of indium-tin-oxide. And finally the n-type electrode layer 49 is formed on n-type gallium-nitride (GaN) layer 43, and it is made of Ti/Al or Cr/Au.

In the above-mentioned structure, the thickness of the respective portions of the short-period super-lattice barrier buffer layer 47 made of (MgN/InN) is between 2 and 200 Å respectively, its number of repetition is 2 or above, and its configuration can be MgN up/InN down or MgN down/InN up, and its growth temperature is between 500° C. and 1200° C.

Embodiment 3

Figure 5:
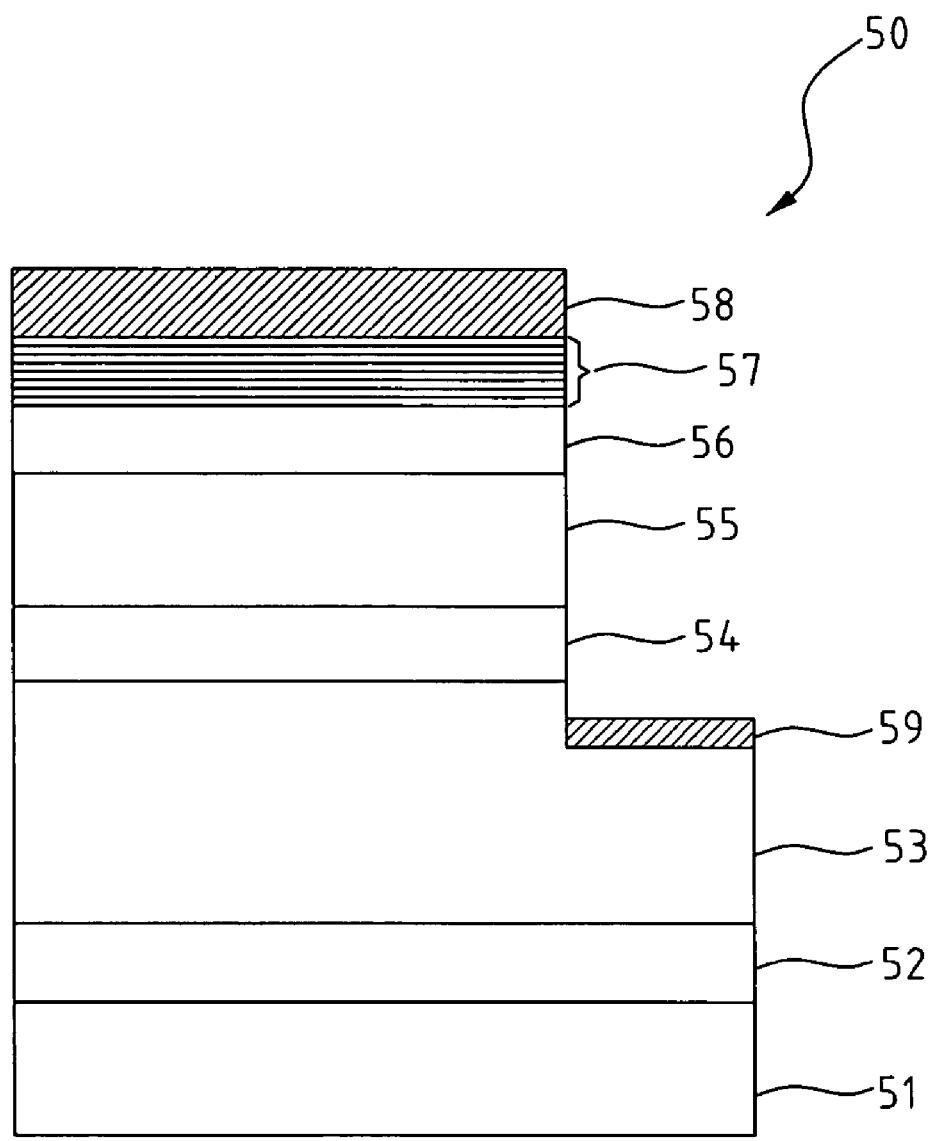
FIG. 5 is a gallium-nitride based light emitting diode structure according to the third embodiment of the present invention.

FIG. 5 shows a gallium-nitride based light emitting diode structure 50 with enhanced light illuminance according to a third embodiment of the present invention, comprising: substrate 51, buffer layer 52, n-type gallium nitride (GaN) layer 53, active light-emitting-layer 54, p-type cladding layer 55, p-type contact layer 56, short-period super-lattice barrier buffer layer 57, transparent contact layer 58, and n-type electrode layer 59.

The bottom layer of the structure is substrate 51, and it is made of Sapphire. And next, the buffer layer 52 is formed on substrate 51, and it is made of aluminum-gallium-indium-nitride ($Al_{1-x-y}Ga_xIn_yN$), wherein $0 \leq x \leq 1$, $0 \leq y \leq 1$ and $x+y \leq 1$. Then, the n-type gallium nitride (GaN) layer 53 is formed on buffer layer 52. And then, the active light-emitting-layer 54 is formed on n-type gallium nitride (GaN) layer 53, and it is made of indium-gallium nitride (InGaN). And next, the p-type cladding layer 55 is formed on active light-emitting-layer 54, and it is made of Mg-doped aluminum-indium-nitride ($Al_{1-x}In_xN$), wherein $0 \leq x < 1$. Then, p-type contact layer 56 is formed on p-type cladding layer 55, and it is made of gallium nitride (GaN). And then, the short-period super-lattice barrier buffer layer 57 is formed on p-type contact layer 56, and it is made of magnesium-nitride/ undoped-indium-gallium-nitride (MgN/In$_x$Ga$_{1-x}$N). And next, the transparent contact layer 58 is formed on the short-period super-lattice barrier buffer layer 57, and it is made of indium-tin-oxide. And finally, the n-type electrode layer 59 is formed on n-type gallium nitride (GaN) layer 53, and it is made of Ti/Al or Cr/Au.

In the above-mentioned structure, the thicknesses of the respective portions of the short-period super-lattice barrier buffer layer 57 made of (MgN/In$_x$Ga$_{1-x}$N) are between 2 and 200 Å respectively, its number of repetition is 2 or above, and its configuration can be MgN up/In$_x$Ga$_{1-x}$N down or MgN down/In$_x$Ga$_{1-x}$N up, and its growth temperature is between 500° C. and 1200° C.

In the above-mentioned three embodiments, indium-tin-nitride (ITO) is utilized as the material of the transparent conductive layer. However, the material utilized for the transparent conductive layer of the present invention is not restricted to ITO, and it may comprise for example ITO, CTO, ZnO:Al, ZnGa$_2$O$_4$, SnO$_2$:Sb, Ga$_2$O$_3$:Sn, AgInO$_2$:Sn, and In$_2$O$_3$:Zn for the n-type transparent conductive oxide (TCO) layer, and CuAlO$_2$, LaCuOS, NiO, CuGaO$_2$, SrCu$_2$O$_2$ for the p-type transparent conductive oxide (TCO) layer.

Figure 1:
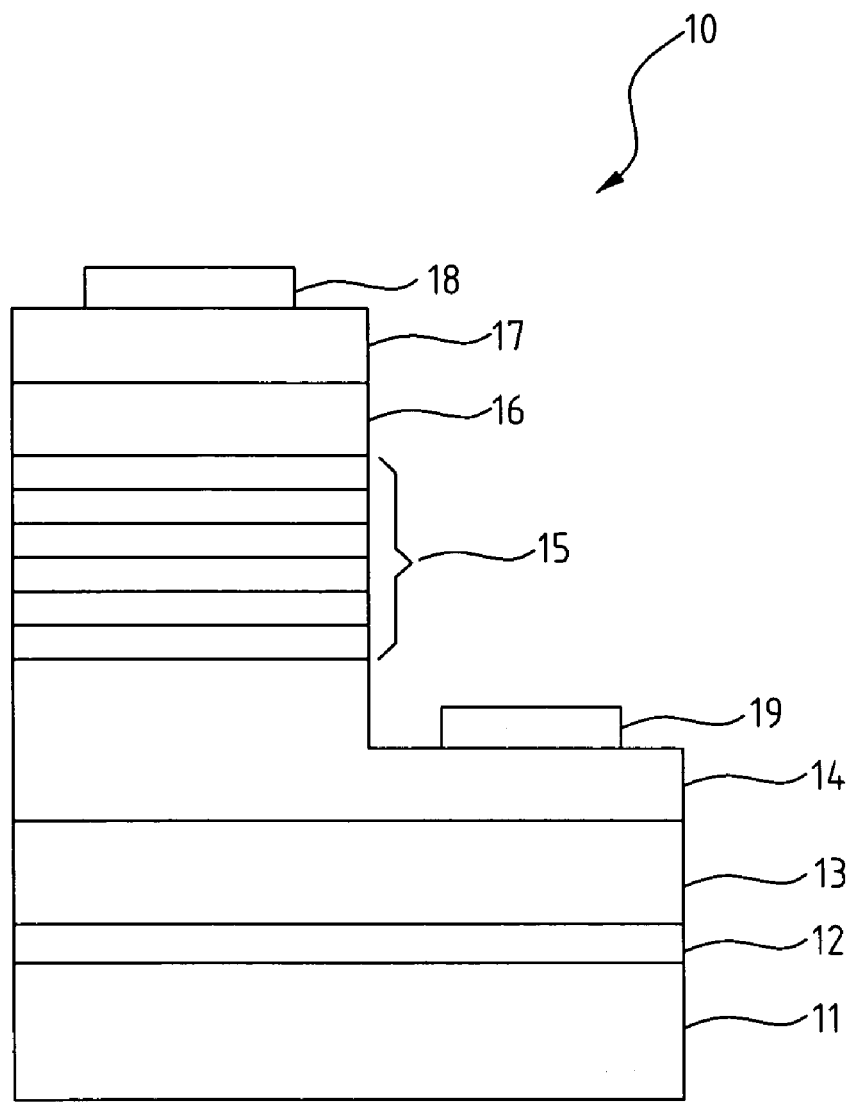
FIG. 1 is a conventional gallium-nitride based light emitting diode structure.
Figure 2:
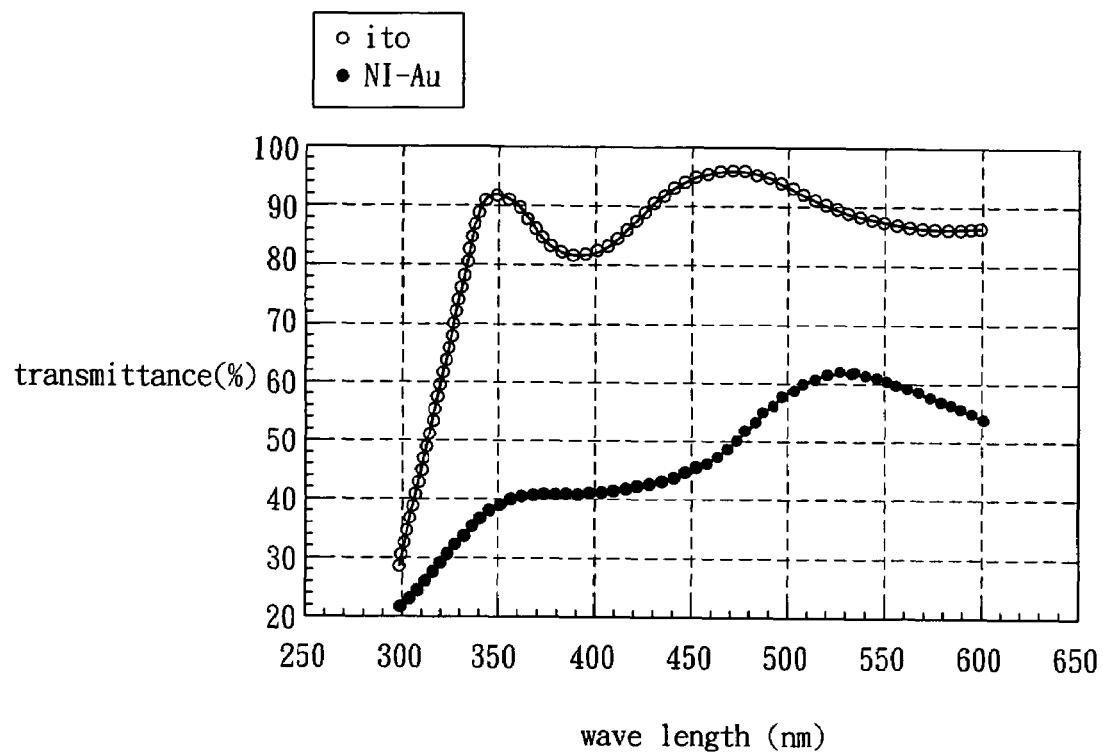
FIG. 2 indicates the comparison of the transmittance of the present invention using ITO as the transparent contact layer material vs that of the prior art using Ni/Au as the transparent contact layer material.

From the three embodiments described in detail above, and the related experimental data as shown in FIG. 2, it is evident that the shortcomings and restrictions of the prior art light emitting diode can certainly be improved by means of the light emitting diode structure of the present invention. And in particular the light transmittance of this kind of light emitting diode can be raised from 62% of the prior art to 95% or above of the present invention, and its light illuminance and light transmittance efficiency can also be raised significantly. Therefore, the present invention does have its value of utilization in the industry, and it is in conformity with the patent requirements.

The purpose of the preferred embodiment described above is only illustrative, and it is not intended to be construed as to be any restrictions to the present invention. Therefore, any variations or modifications made within the spirit and scope of the present invention can be included in the scope of protection of the attached claims.

What is claimed is:

1. A gallium-nitride (GaN) based light emitting diode structure with enhanced light illuminance, comprising:
   a substrate made of Sapphire;
   a buffer layer formed on the said substrate and made of aluminum-gallium-indium-nitride (Al$_{1-x-y}$Ga$_x$In$_y$N), wherein 0≦x,1, 0≦y<1, and x+y≦1;
   an n-type gallium nitride (GaN) layer formed on the said buffer layer;
   an active light-emitting-layer formed on the n-type gallium-nitride(GaN) layer and made of indium-gallium-nitride (InGaN);
   a p-type cladding layer formed on the said active light-emitting-layer and made of Mg-doped aluminum-indium-nitride (Al$_{1-x}$In$_x$N), wherein 0≦x<1;
   a p-type contact layer formed on the p-type cladding layer and made of gallium-nitride (GaN);
   a short-period super-lattice barrier buffer layer formed on the p-type contact layer and made of magnesium-nitride/indium-gallium-nitride (MgN/In$_x$Ga$_{1-x}$N);
   a transparent contact layer formed on the short-period super-lattice barrier buffer layer and made of indium-tin-oxide (ITO); and
   an n-type electrode layer formed on n-type gallium nitride (GaN) layer and made of Ti/Al or Cr/Au.

2. The gallium-nitride (GaN) based light emitting diode structure with enhanced light illuminance as claimed in claim 1, wherein the short-period super-lattice barrier buffer layer is made of magnesium-nitride/undoped-indium-gallium-nitride (MgN/In$_x$Ga$_{1-x}$N), and having a configuration of MgN up/In$_x$Ga$_{1-x}$N down or MgN down/In$_x$Ga$_{1-x}$N up, the number of repetition of the configuration being 2 or above, and having a thickness is between 2–200 Å respectively.

3. The gallium-nitride (GaN) based light emitting diode structure with enhanced light illuminance as claimed in claim 1, wherein the growth temperature of the short-period super-lattice barrier buffer layer is 500–1200° C.

4. The gallium-nitride (GaN) based light emitting diode structure with enhanced light illuminance as claimed in claim 1, wherein the thickness of the transparent contact layer is less than or equal to 5000 Å.

5. The gallium-nitride (GaN) based light emitting diode structure with enhanced light illuminance as claimed in claim 1, wherein the growth temperature of the transparent contact layer is 100–600° C.

6. The gallium-nitride (GaN) based light emitting diode structure with enhanced light illuminance as claimed in claim 1, wherein for an n-type transparent conductive oxide (TCO) layer, the transparent contact layer comprises a material selected from a group consisting of ITO, CTO, ZnO:Al, ZnGa$_2$O$_4$, SnO$_2$:Sb, Ga$_2$O$_3$:Sn, AgInO$_2$:Sn, and In$_2$O$_3$:Zn and wherein for a p-type transparent conductive oxide (TCO) layer, the transparent contact layer comprises a material selected from a group consisting of CuAlO$_2$, LaCuOS, NiO, CuGaO$_2$, and SrCu$_2$O$_2$.

* * * * *